(12) United States Patent
Ujiie

(10) Patent No.: US 11,711,078 B2
(45) Date of Patent: Jul. 25, 2023

(54) ON/OFF DETECTION DEVICE AND VEHICLE INTERIOR COMPONENT

(71) Applicant: Marelli Corporation, Saitama (JP)

(72) Inventor: Hideto Ujiie, Saitama (JP)

(73) Assignee: Marells Corporation, Saitama (JP)

(*) Notice: Subject to any disclaimer, the term of this patent is extended or adjusted under 35 U.S.C. 154(b) by 362 days.

(21) Appl. No.: 17/265,683

(22) PCT Filed: Aug. 7, 2019

(86) PCT No.: PCT/JP2019/031234
§ 371 (c)(1),
(2) Date: Feb. 3, 2021

(87) PCT Pub. No.: WO2020/045011
PCT Pub. Date: Mar. 5, 2020

(65) Prior Publication Data
US 2021/0313983 A1 Oct. 7, 2021

(30) Foreign Application Priority Data
Aug. 29, 2018 (JP) .............................. JP2018-159909
Jul. 31, 2019 (JP) .............................. JP2019-141131

(51) Int. Cl.
H03K 17/96 (2006.01)
B60K 37/06 (2006.01)
(Continued)

(52) U.S. Cl.
CPC ........... H03K 17/962 (2013.01); B60K 37/06 (2013.01); G01L 1/14 (2013.01); H03K 5/24 (2013.01);
(Continued)

(58) Field of Classification Search
CPC ................... H03K 17/962; H03K 5/24; H03K 2217/96071; H03K 17/975;
(Continued)

(56) References Cited

U.S. PATENT DOCUMENTS

2012/0306799 A1   12/2012   Nakayama
2015/0084874 A1   3/2015    Cheng et al.
(Continued)

FOREIGN PATENT DOCUMENTS

JP           5160683 B2        3/2013
WO        2011/099361 A1      8/2011
WO        2018/094673 A1      5/2018

Primary Examiner — Jung Kim
(74) Attorney, Agent, or Firm — Global IP Counselors, LLP

(57) ABSTRACT

An ON/OFF detection device is configured to detect ON/OFF of an input unit using a load sensor, and includes a threshold setting unit, a comparison unit, and an ON/OFF determination unit. The threshold setting unit is configured to set a threshold value with respect to a previous detection value of the load sensor. The comparison unit is configured to compare the threshold value and a current detection value. The ON/OFF determination unit is configured to determine ON/OFF of the input unit based on a comparison result. When a previous determination result of the ON/OFF determination unit is ON, the threshold setting unit is configured to set the threshold value to be lower than the previous detection value. When the previous determination result of the ON/OFF determination unit is OFF, the threshold setting unit is configured to set the threshold value to be higher than the previous detection value.

12 Claims, 13 Drawing Sheets

(51) Int. Cl.
*G01L 1/14* (2006.01)
*H03K 5/24* (2006.01)

(52) U.S. Cl.
CPC .................... *B60K 2370/12* (2019.05); *H03K 2217/96071* (2013.01)

(58) Field of Classification Search
CPC .......... H03K 2217/96062; B60K 37/06; B60K 2370/12; G01L 1/14; G01L 1/142
See application file for complete search history.

(56) References Cited

U.S. PATENT DOCUMENTS

2016/0370909 A1   12/2016  Wang et al.
2017/0336891 A1*  11/2017  Rosenberg ............ G06F 3/0412
2019/0065720 A1   2/2019   Lin et al.

* cited by examiner

ON/OFF DETECTION DEVICE AND VEHICLE INTERIOR COMPONENT

CROSS-REFERENCE TO RELATED APPLICATION

This is a U.S. national phase application of PCT/JP2019/031234, filed on Aug. 7, 2019, which claims priority to Japanese Patent Application No. 2018-159909 filed in Japan on Aug. 29, 2018 and Japanese Patent Application No. 2019-141131 filed in Japan on Jul. 31, 2019. The entire disclosures of Japanese Patent Application Nos. 2018-159909 and 2019-141131 are incorporated herein by reference.

TECHNICAL FIELD

The present invention relates to an ON/OFF detection device that detects ON/OFF of an input unit, and to a vehicle interior component to which the ON/OFF detection device is applied.

BACKGROUND ART

From the past, a device is known that detects ON/OFF of an input unit by comparing a detected value of a load sensor and a threshold value.

Disclosed in JP5160683B is a configuration by which when a pressing load that exceeds a load reference value is detected, a control unit determines that an input object displayed on a display unit is depressed. This makes it possible to have the input unit recognize input as repeated pressing input when input such as with the pressing force being raised and lowered continuously with respect to the load reference value is performed.

SUMMARY

However, with the device noted in JP5160683B, when input is performed so that the pressing force is raised and lowered continuously with a pressing force that exceeds the load reference value, there is a risk that repeated pressing input cannot be detected.

The purpose of the present invention is to provide an ON/OFF detection device that can accurately detect repeated pressing input and a vehicle interior component.

According to a mode of the present invention, the ON/OFF detection device that detects ON/OFF of the input unit using a load sensor comprises: a threshold setting unit that sets a threshold value with respect to a previous detection value of the load sensor; a comparison unit that compares the threshold value set by the threshold setting unit and the current detection value of the load sensor; and an ON/OFF determination unit that determines ON/OFF of the input unit based on the comparison result of the comparison unit, wherein when the previous determination result of the ON/OFF determination unit is that the input unit is ON, the threshold setting unit sets the threshold value to be lower than the previous detection value of the load sensor, and when the previous determination result of the ON/OFF determination unit is that the input unit is OFF, the threshold setting unit sets the threshold value to be higher than the previous detection value of the load sensor.

According to another mode of the present invention, with the vehicle interior component, the ON/OFF detection device is applied to the input unit provided in an interior material installed in a vehicle.

According to the abovementioned mode, with the ON/OFF detection device and the vehicle interior component, it is possible to accurately detect repeated pressing input.

DETAILED DESCRIPTION OF EMBODIMENTS

Following, embodiments of the present invention are explained while referring to drawings.

First Embodiment

Following, while referring to FIG. 1 to FIG. 10, an instrument panel 1 as an ON/OFF detection device 101 and a vehicle interior component are explained. The ON/OFF detection device 101 is applied to the instrument panel 1 provided inside the passenger compartment of a vehicle.

Configuration of Vehicle Interior Component

Figure 1:
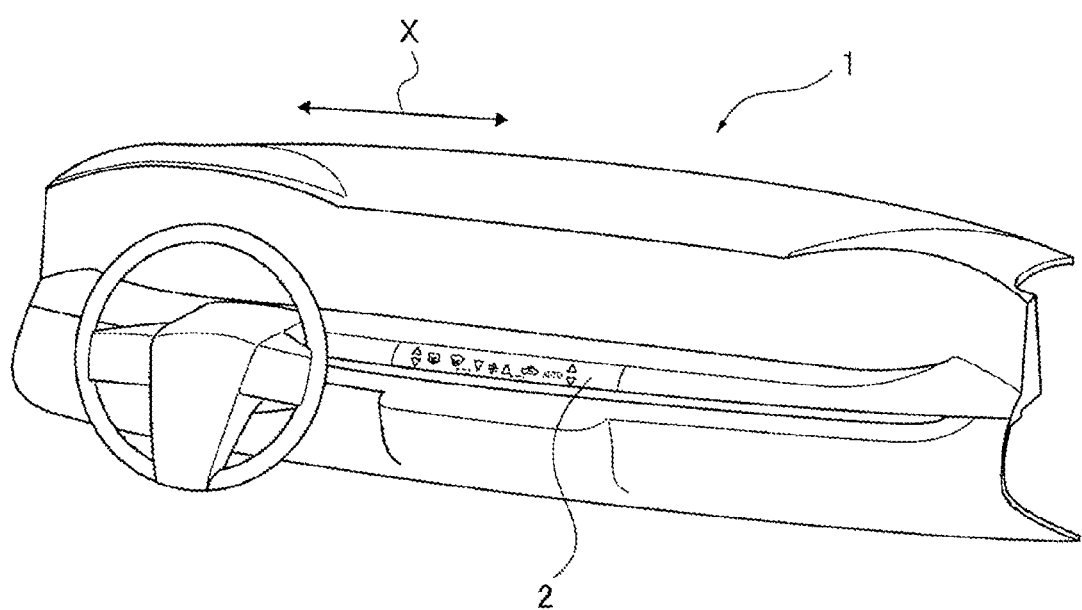
FIG. 1 is a perspective view showing the configuration of a vehicle interior component of a first embodiment of the present invention.
Figure 2:
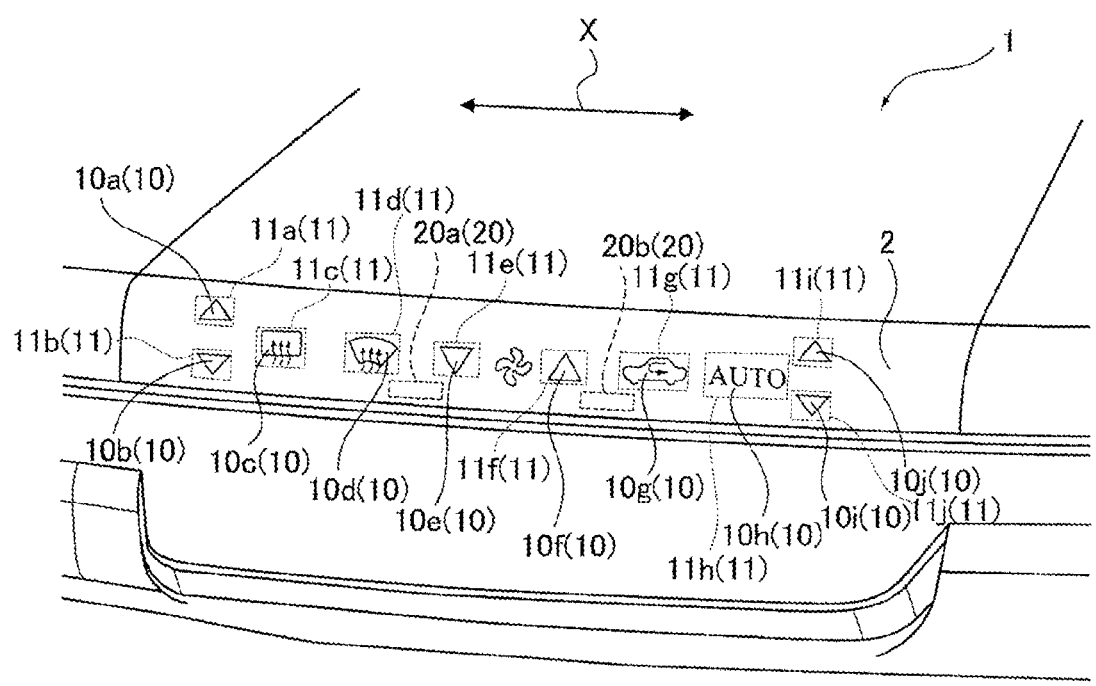
FIG. 2 is a perspective view showing the configuration of an interior material of the vehicle interior component.

Following, referring to FIG. 1 and FIG. 2, the configuration of the instrument panel 1 is explained. FIG. 1 is a perspective view showing the configuration of the instrument panel 1. FIG. 2 is a perspective view showing the configuration of a finisher 2 as an interior material of the instrument panel 1. Following, the width direction of the vehicle is width direction X.

As shown in FIG. 1, the instrument panel 1 comprises the finisher 2.

As shown in FIG. 2, the finisher 2 comprises a first switch 10a to a tenth switch 10j to operate an air conditioner (air conditioner) as a switch 10 as the input unit, for example.

The first switch 10a, the second switch 10b, the ninth switch 10i, and the tenth switch 10j are switches for adjusting the temperature of the air conditioner. The third switch 10c is a switch for turning the rear defogger ON/OFF. The fourth switch 10d is a switch for turning the front defroster ON/OFF. The fifth switch 10e and the sixth switch 10f are switches for adjusting the air volume of the air conditioner. The seventh switch 10g is a switch for switching between inside and outside air. The eight switch 10h is a switch for turning the auto mode ON/OFF.

Touch position sensors 11 and load sensors 20 are attached to the rear surface of the finisher 2.

The touch position sensors 11 are provided corresponding to each switch 10, and detect that the finger of a user has touched each switch 10. Specifically, a first touch position sensor 11a is provided at the position corresponding to the first switch 10a. A second touch position sensor 11b is provided at the position corresponding to the second switch 10b. A tenth touch position sensor 11j is provided at the position corresponding to the tenth switch 10j.

The load sensor 20 comprises a first load sensor 20a, and a second load sensor 20b. The load sensor 20 detects the load applied to each switch 10.

The first load sensor 20a is provided between the fourth switch 10d and the fifth switch 10e, and below the fourth switch 10d and the fifth switch 10e. The second load sensor 20b is provided between the sixth switch 10f and the seventh switch 10g, and below the sixth switch 10f and the seventh switch 10g.

Configuration of the Touch Position Sensor

Figure 3:
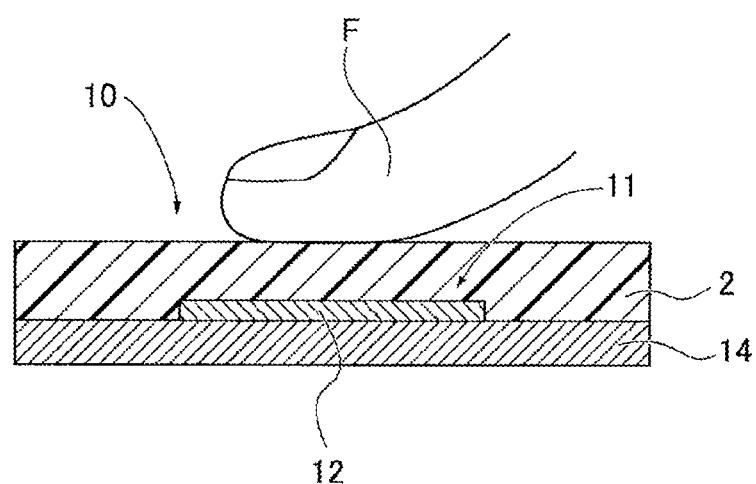
FIG. 3 is a cross section view showing a configuration of a touch position sensor.

Following, the configuration of the touch position sensor 11 is explained while referring to FIG. 3. FIG. 3 is a cross section diagram showing the configuration of the touch position sensor 11.

As shown in FIG. 3, the touch position sensor 11 is provided on the rear surface of the finisher 2, corresponding to each switch 10. The touch position sensor 11 has a plate shaped electrode 12 placed on a substrate 14.

The touch position sensor 11 measures the electrostatic capacitance value at cycles of 10 [ms], for example. When a finger F of the user touches the switch 10, the electrostatic capacitance value measured by the touch position sensor 11 changes. From this change in electrostatic capacitance value, it is possible to know which switch 10 was touched by the finger F of the user.

[Configuration of the Load Sensor]

Figure 4:
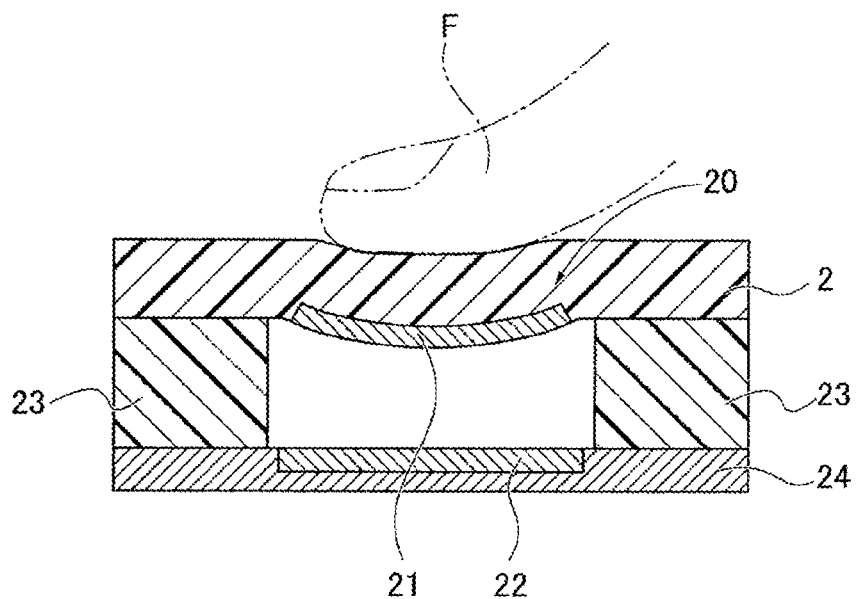
FIG. 4 is a cross section view showing a configuration of a load sensor.

Following, the configuration of the load sensor 20 is explained while referring to FIG. 4. FIG. 4 is a cross section diagram showing the configuration of the load sensor 20.

As shown in FIG. 4, the load sensor 20 is configured from a plate shaped first electrode 21, a plate shaped second electrode 22, a spacer 23, and a substrate 24.

The first electrode 21 is provided on the rear surface of the finisher 2. The second electrode 22 is provided on the substrate 24. The spacer 23 is provided between the finisher 2 and the substrate 24, and the first electrode 21 and the second electrode 22 are arranged facing with a gap therebetween. The first electrode 21 and the second electrode 22 may also be arranged facing with an elastic layer interposed.

The load sensor 20 measures the electrostatic capacitance value between the first electrode 21 and the second electrode 22 at cycles of 10 [ms], for example. When the user presses and operates the switch 10 using the finger F, the finisher 2 is recessed. When the finisher 2 is recessed, the distance between the first electrode 21 and the second electrode 22 becomes narrower. Having done that, the electrostatic capacitance value between the first electrode 21 and the second electrode 22 changes. The size of the load (load detection strength) is made to be known from the change in the electrostatic capacitance value between the first electrode 21 and the second electrode 22.

Functional Configuration of the ON/OFF Detection Device

Figure 5:
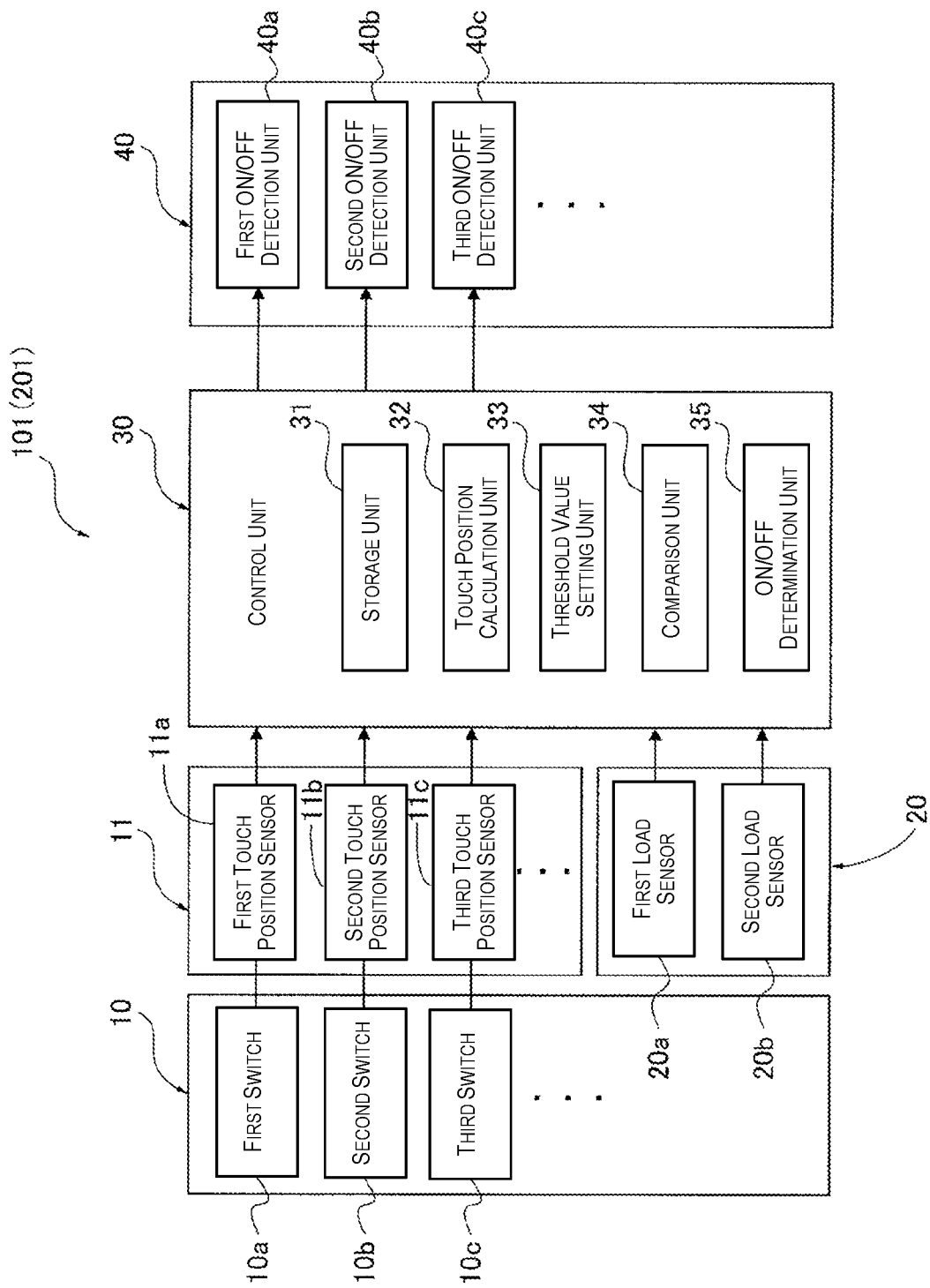
FIG. 5 is a functional configuration diagram shown the functional configuration of an ON/OFF detection device.

Following, the functional configuration of the ON/OFF detection device 101 is explained while referring to FIG. 5. FIG. 5 is a functional configuration diagram showing the functional configuration of the ON/OFF detection device 101.

As shown in FIG. 5, the ON/OFF detection device 101 comprises the switch 10, the touch position sensor 11, the load sensor 20, a control unit 30, and an ON/OFF detection unit 40.

The switch 10 is configured from the first switch 10a to the tenth switch 10j.

The touch position sensor 11 is configured from the first touch position sensor 11a to the tenth touch position sensor 11j. Each touch position sensor 11 is arranged facing each corresponding switch 10. The electrostatic capacitance value detected by each touch position sensor 11 is transmitted to the control unit 30.

The load sensor 20 is configured from a first load sensor 20a and a second load sensor 20b. The electrostatic capacitance values detected by the first load sensor 20a and the second load sensor 20b are transmitted to the control unit 30.

The control unit 30 controls various types of operation of the ON/OFF detection device 101. The control unit 30 is configured by a microcomputer comprising a central processing unit (CPU), read only memory (ROM), random access memory (RAM), and an input/output interface (I/O interface). The control unit 30 controls various types of operation of the ON/OFF detection device 101 by having programs stored in the ROM read by the CPU. The control unit 30 can also be configured by a plurality of microcomputers.

The control unit 30 comprises a storage unit 31, a touch position calculation unit 32, a threshold setting unit 33, a comparison unit 34, and an ON/OFF determination unit 35. The control unit 30 executes an ON/OFF determination process described later. The control unit 30 does overall control of the ON/OFF detection device 101.

The storage unit 31 stores the threshold value used by the threshold setting unit 33, an ON/OFF determination process program described later, the electrostatic capacitance value measured by the touch position sensor 11, and the electrostatic capacitance value measured by the load sensor 20, etc.

The touch position calculation unit 32 calculates whether in a touch state in which the finger F of the user is touching any of the switches 10 from the change in the electrostatic capacitance value measured by the touch position sensor 11. Specifically, the touch position calculation unit 32 calculates the touch position from the change in the electrostatic capacitance value measured by the touch position sensor 11.

The threshold setting unit 33 sets as the threshold values a first threshold value A, a second threshold value B, a third threshold value C, and a fourth threshold value D. The first threshold value A is the threshold value set when the touch position sensor 11 is in the OFF state.

The second threshold value B is the threshold value greater than the first threshold value A, and is the threshold value set when the touch position sensor 11 is in the ON state. The second threshold value B is set lower the closer that the distance from the load sensor 20 to the touch position is. Said another way, the second threshold value B is set higher the farther that the distance from the load sensor 20 to the touch position is.

For example, the second threshold value B when the touch position calculation unit 32 calculates the first switch 10a as the touch position is set lower than the second threshold value B when the touch position calculation unit 32 calculates the fourth switch 10d as the touch position. Specifically, the second threshold value B is set based on the touch position calculated by the touch position calculation unit 32.

The third threshold value C and the fourth threshold value D are set based on the previous detection value of the load sensor 20. The third threshold value C is set to be lower than the previous detection value of the load sensor 20 when the previous determination result of the ON/OFF determination unit 35 is ON. The fourth threshold value D is set to be higher than the previous detection value of the load sensor 20 when the previous determination result of the ON/OFF determination unit 35 is OFF.

Figure 6:
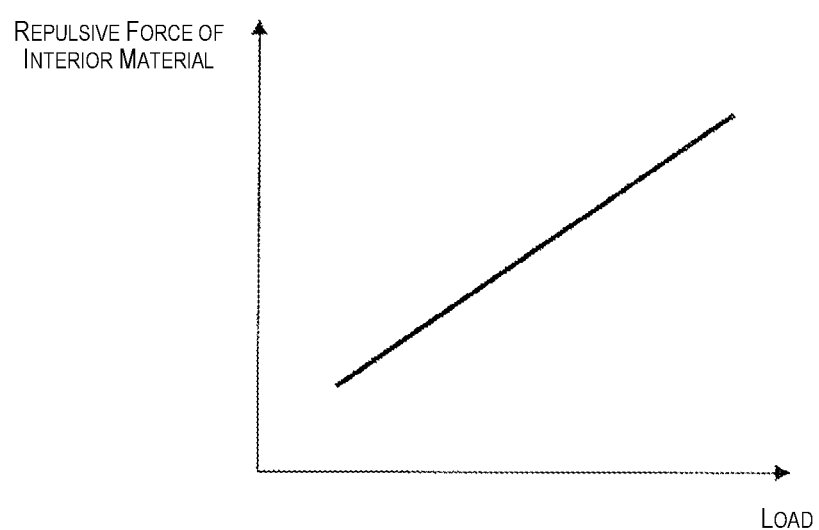
FIG. 6 is a graph that explains the relationship between the interior material repulsive force and the load.

Here, referring to FIG. 6, the relationship of the interior material repulsive force and the load is explained. FIG. 6 is a graph that explains the relationship between the interior material repulsive force and the load.

As shown in FIG. 6, the trend is for the repulsive force of the interior material to become larger as the load input to the interior material becomes larger.

In light of that, the threshold setting unit 33 sets the third threshold value C and the fourth threshold value D so that the difference with the previous detection value of the load sensor 20 becomes greater the greater that the load input to the switch 10 is. Specifically, the threshold setting unit 33 sets the third threshold value C and the fourth threshold value D so that the absolute value of the difference between the previous detection value of the load sensor 20 and the threshold value becomes greater the greater the load input to the switch 10 is.

The comparison unit 34 compares the third threshold value C and the fourth threshold value D set by the threshold setting unit 33 with the current detection value of the load sensor 20.

The ON/OFF determination unit 35 determines whether the switch 10 is in the ON state or the OFF state.

The ON/OFF detection unit 40 has a first ON/OFF detection unit 40a to a tenth ON/OFF detection unit 40j corresponding to the first switch 10a to the tenth switch 10j. Each ON/OFF detection unit 40 detects ON/OFF of each switch 10 based on the processing results of the ON/OFF determination process by the control unit 30.

ON/OFF Determination Process

Figure 7:
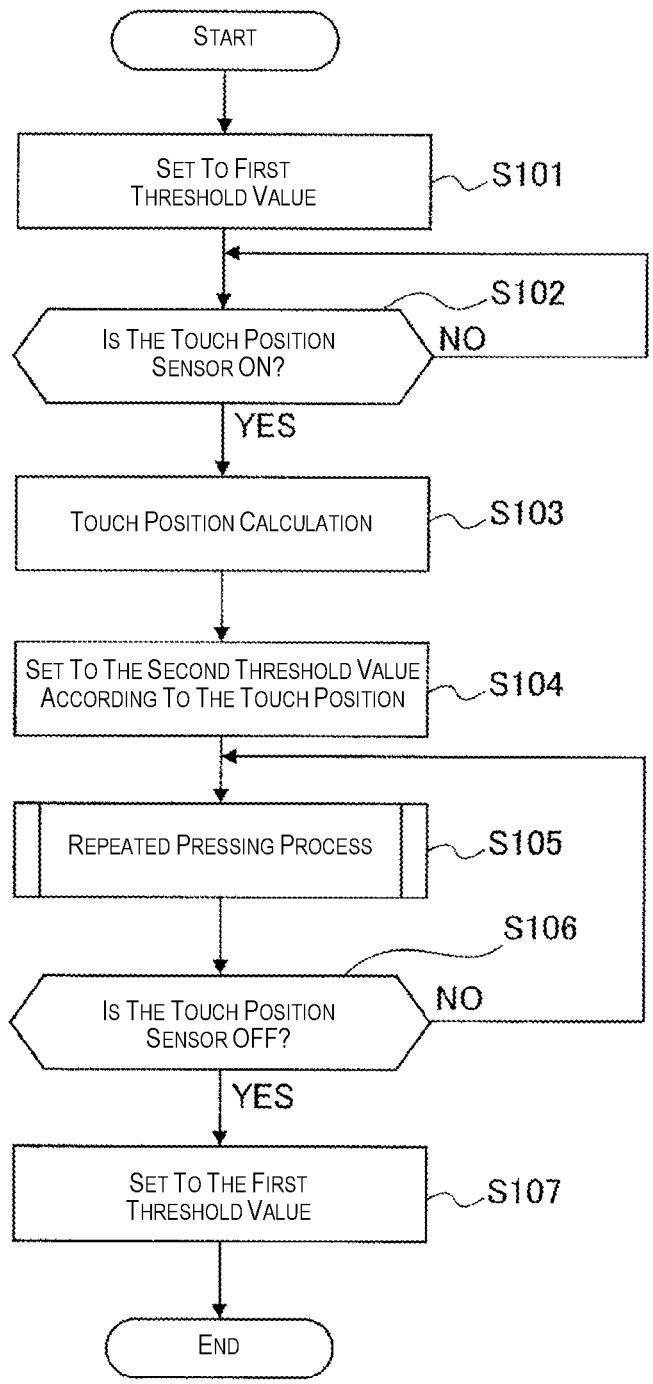
FIG. 7 is a flow chart showing the ON/OFF determination process.

Following, the ON/OFF determination process is explained while referring to FIG. 7. FIG. 7 is a flow chart showing the ON/OFF determination process.

When the ON/OFF determination process is started, initialization is executed, and the threshold setting unit 33 sets the threshold value of the load sensor 20 to the first threshold value A (step S101).

Next, the touch position calculation unit 32 determines whether the touch position sensor 11 is ON (step S102). When it is determined that the touch position sensor 11 is OFF (NO at step S102), the process returns to step S102. Meanwhile, when it is determined that the touch position sensor 11 is ON (YES at step S102), the touch position calculation unit 32 calculates the touch position (step S103).

Next, the threshold setting unit 33 sets the threshold value of the load sensor 20 to the second threshold value B according to the touch position (step S104).

Next, the control unit 30 executes a repeated pressing process (step S105). The repeated pressing process is explained in detail later while referring to FIG. 8.

Next, the touch position calculation unit 32 determines whether the touch position sensor 11 is OFF (step S106). When it is determined that the touch position sensor 11 is ON (NO at step S106), the process returns to step S105. Meanwhile, when it is determined that the touch position sensor 11 is OFF (YES at step S106), the process advances to step S107.

Next, the threshold setting unit 33 sets the threshold value of the load sensor 20 to the first threshold value A (step S107), and the ON/OFF determination process is ended.

Repeated Pressing Process

Figure 8:
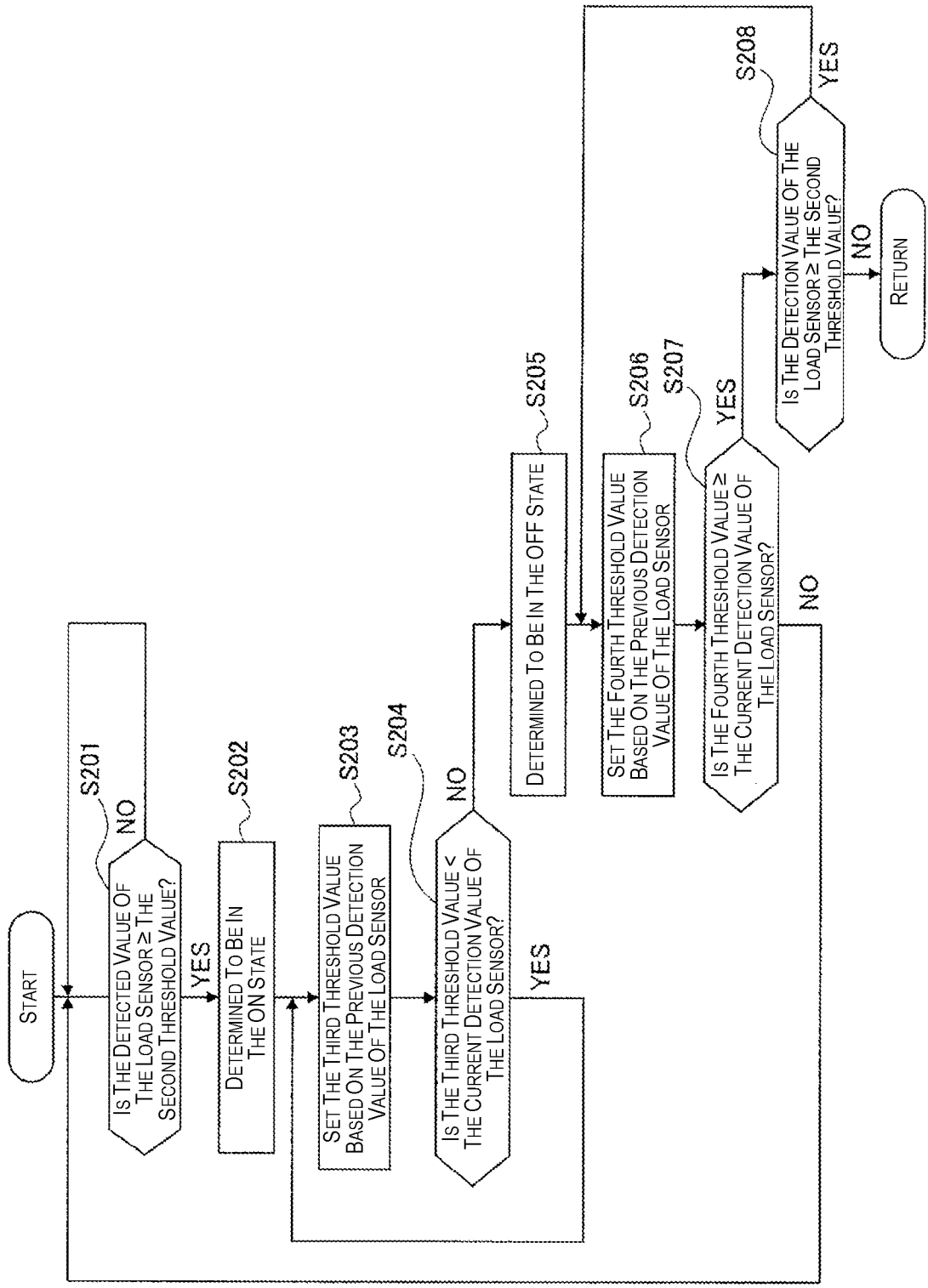
FIG. 8 is a flow chart showing the repeated pressing process.

Following, the repeated pressing process is explained while referring to FIG. 8. FIG. 8 is a flow chart showing the repeated pressing process.

When the repeated pressing process is started, the comparison unit 34 determines whether the detection value of the load sensor 20 is the second threshold value B or greater (step S201). When the detection value of the load sensor 20 is determined to be the second threshold value B or greater (YES at step S201), the process advances to step S202. Meanwhile, when the detection value of the load sensor 20 is determined to be less than the second threshold value B (NO at step S201), the process returns to step S201. Specifically, until the detection value of the load sensor 20 is determined to be the second threshold value B or greater, the ON/OFF determination unit 35 determines that the switch 10 is in the OFF state.

Next, the ON/OFF determination unit 35 determines that the switch 10 is in the ON state (step S202). Next, the threshold setting unit 33 sets the third threshold value C based on the previous detection value of the load sensor 20 (step S203).

Next, the comparison unit 34 determines whether the third threshold value C is less than the current detection value of the load sensor 20 (step S204). When it is determined that the third threshold value C is less than the current detection value of the load sensor 20 (YES at step S204), the process returns to step S203. Meanwhile, when it is determined that the third threshold value c is the current detection value of the load sensor 20 or greater (NO at step S204), the process advances to step S205.

Next, the ON/OFF determination unit 35 determines that the switch 10 is in the OFF state (step S205). Next, the threshold setting unit 33 sets the fourth threshold value D based on the previous detection value of the load sensor 20 (step S206).

Next, the comparison unit 34 determines whether the fourth threshold value D is the current detection value of the load sensor 20 or greater (step S207). When it is determined that the fourth threshold value D is less than the current detection value of the load sensor 20 (NO at step S207), the process returns to step S201. Meanwhile, when it is determined that the fourth threshold value D is the current detection value of the load sensor 20 or greater (YES at step S207), the process advances to step S208.

Next, the comparison unit 34 determines whether the detection value of the load sensor 20 is the second threshold value B or greater (step S208). When it is determined that the detection value of the load sensor 20 is the second threshold value B or greater (YES at step S208), the process returns to step S206. Meanwhile, when it is determined that the detection value of the load sensor 20 is less than the second threshold value B (NO at step S208), the process returns to the main flow in FIG. 7.

Flow of the ON/OFF Determination Process

Figure 9:
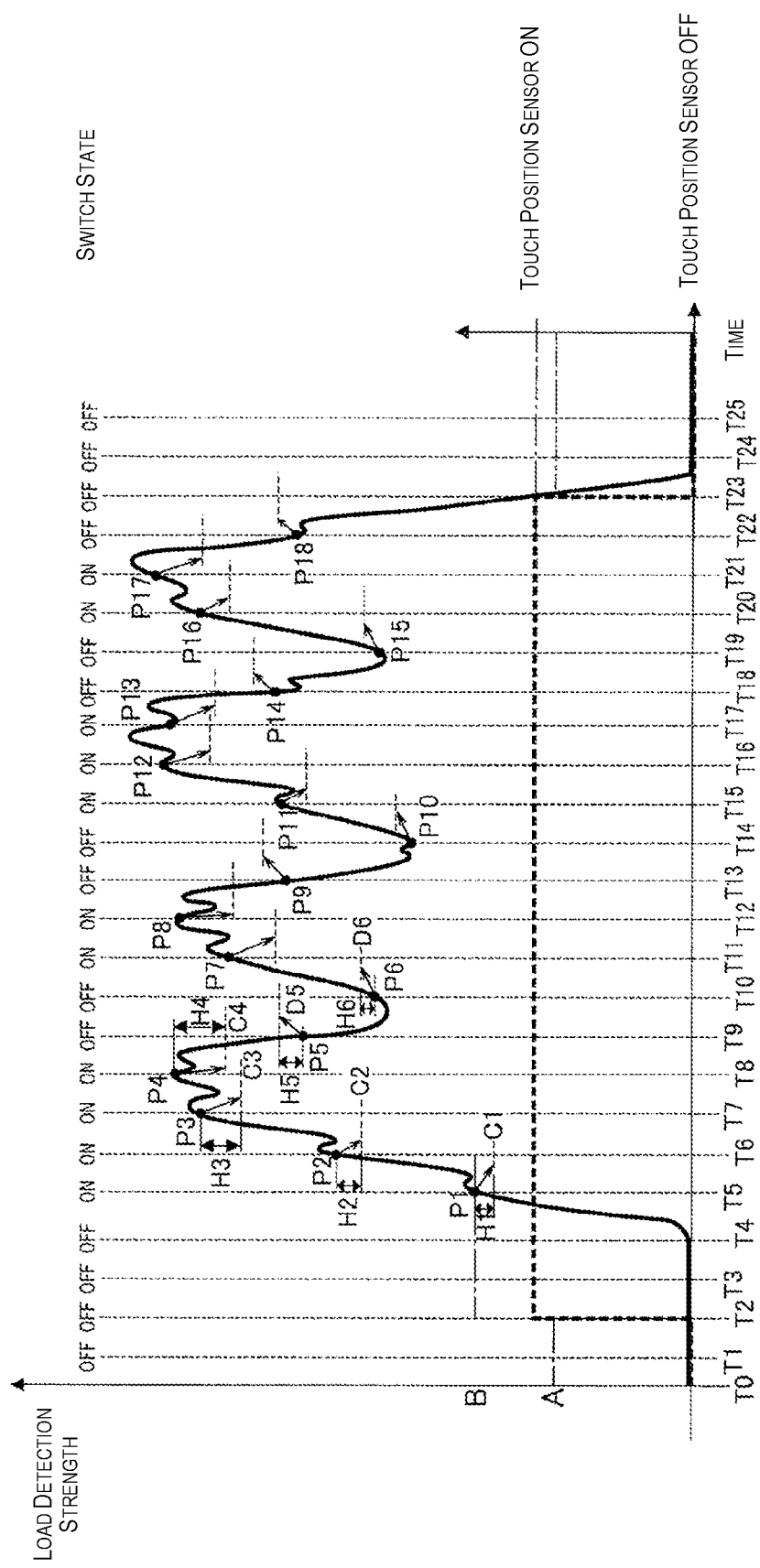
FIG. 9 is a timing chart that explains the flow of the ON/OFF determination process.

Following, the flow of the ON/OFF determination process is explained while referring to FIG. 9. FIG. 9 is a timing chart that explains the flow of the ON/OFF determination process. FIG. 9 shows load detection strength detected by the load sensor 20 in 10 [ms] cycles.

At time T0, the state is with the switch 10 not touched by the user. In this state, the touch position sensor 11 is OFF, and the threshold value of the load sensor 20 is set to the first threshold value A.

At time T2, the state is with the switch 10 touched by the user. In this state, the touch position sensor 11 is ON, and the threshold value of the load sensor 20 is set to the second threshold value B.

At time T4, the state is with the switch 10 starting to be pressed by the user, and is a state with the ON operation started. In this state, the load sensor 20 measures a measurement value (load detection strength) lower than the second threshold value B.

At time T5, the state is with the switch 10 pressed midway by the user, and this is a state with the ON operation implemented. In this state, the load sensor 20 measures a measurement value P1 higher than the second threshold value B, and the switch 10 goes from the OFF state to the ON state. Also, at time T5, the third threshold value C is set to a third threshold value C1 that is H1 lower than the measurement value P1.

At time T6, the state is with switch 10 pressed midway by the user, and is a state with the ON operation implemented. In this state, the load sensor 20 measures a measurement value P2 higher than the third threshold value C1 of T5, and the switch 10 is in the ON state. Also, at time T6, the third threshold value C is set to a third threshold value C1 that is H2 lower than the measurement value P2. H2 is a value greater than H1.

At time T7, the state is with the switch 10 pressed midway by the user, and the state is with the ON operation implemented. In this state, the load sensor 20 measures a measurement value P3 higher than the third threshold value C2 of T6, and the switch 10 is in the ON state. Also, at time T7, the third threshold value C is set to a third threshold value C3 that is H3 lower than the measurement value P3. H3 is a value greater than H2.

At time T8, the state is with the switch 10 pressed midway by the user, and the state is with the ON operation implemented. In this state, the load sensor 20 measures a measurement value P4 higher than the third threshold value C3 of T7, and the switch 10 is in the ON state. Also, at time T8, the third threshold value C is set to a third threshold value C4 that is H4 lower than the measurement value P4. H4 is a value greater than H3.

At time T9, the state is with the switch 10 pulled midway (returned midway) by the user, and is a state with the OFF operation implemented. In this state, the load sensor 20 measures a measurement value P5 that is lower than the third threshold value C4 of T8, and the switch 10 goes from the ON state to the OFF state. Also, at time T9, the fourth threshold value D is set to a fourth threshold value D5 that is H5 higher than the measurement value P5. H5 is a value that is smaller than H4.

At time T10, the state is with the switch 10 pulled midway (returned midway) by the user, and is a state with the OFF operation implemented. In this state, the load sensor 20 measures a measurement value P6 lower than the fourth threshold value D5 of T9, and the switch 10 is in the OFF state. Also, at time T10, the fourth threshold value D is set to a fourth threshold value D6 that is H6 lower than the measurement value P6. H6 is a value smaller than H5.

In this way, up to T22, a threshold value set with respect to the previous detection value of the load sensor 20 and the current detection value of the load sensor 20 are compared, and ON/OFF of the switch 10 is determined. Also, when the switch 10 is in the ON state, the threshold value is set to be lower than the detection value of the load sensor 20, and when the switch 10 is in the OFF state, the threshold value is set to be higher than the detection value of the load sensor.

At time T23, the state is with the finger F of the user separated from the switch 10. In this state, the touch position sensor 11 is OFF, and the threshold value of the load sensor 20 is set to the first threshold value A.

Operation of the ON/OFF Detection Device and Vehicle Interior Component

Following, the operation of the ON/OFF detection device 101 and the vehicle interior component (instrument panel 1) is explained. The ON/OFF detection device 101 is the ON/OFF detection device 101 that detects ON/OFF of the input unit (switch 10) using the load sensor 20. This ON/OFF detection device 101 comprises: the threshold setting unit 33 that sets the threshold value with respect to the previous detection value of the load sensor 20; the comparison unit 34 that compares the threshold value set by the threshold setting unit 33 and the current detection value of the load sensor 20; and the ON/OFF determination unit 35 that determines ON/OFF of the input unit (switch 10) based on the comparison result of the comparison unit 34 (FIG. 5).

This makes it possible to update the threshold value to a value corresponding to the previous detection value. For that reason, compared to when the threshold value is kept constant, it is possible to determine ON/OFF of the input unit (switch 10) at a more detailed level. As a result, even when there is repeated pressing such as with continuous ON/OFF input to the input unit (switch 10), it is possible to accurately detect ON/OFF of the input unit (switch 10). Specifically, even if there is a difference in pressing force or pressing method during repeated pressing by an operator, it is possible to detect ON/OFF of the input unit (switch 10).

However, the input operation to the input unit (switch 10) is performed by pressing the input unit (switch 10) using the finger F of the user. Also, repulsive force is generated in the input unit (switch 10) with respect to the input load. For this reason, the detection value of the load sensor 20 is an unstable value. In particular, when implementing haptics to impart a tactile sensation using vibration to match the ON operation or the OFF operation, the value is even more unstable.

For that reason, regardless of whether there is an ON operation in the input unit (switch 10), OFF of the input unit (switch 10) may be detected, and regardless of whether there is an OFF operation in the input unit (switch 10), ON of the input unit (switch 10) may be detected.

With the ON/OFF detection device 101, when the previous determination result of the ON/OFF determination unit 35 is that the input unit (switch 10) is ON, the threshold setting unit 33 sets the threshold value to be lower than the previous detection value of the load sensor 20, and when the previous determination result of the ON/OFF determination unit 35 is that the input unit (switch 10) is OFF, the threshold setting unit 33 sets the threshold value to be higher than the previous detection value of the load sensor 20 (FIG. 9).

This makes it possible to set the threshold value considering the detection value of the load sensor 20 that is unstable. Specifically, it is possible to give a margin to the threshold value considering the detection value of the load sensor 20 that is unstable. For that reason, even if the detection value of the load sensor 20 was an unstable value, it is possible to prevent detection of unintended ON/OFF of the input unit (switch 10).

However, the greater the load that is input to the input unit (switch 10), the greater the repulsive force from the input unit (switch 10). Also, the greater the load that is input to the input unit (switch 10), the operator may put force into the finger F, and the finger F may be shaky. For that reason, the greater the load that is input to the input unit (switch 10), the more unstable a value the detection value detected by the load sensor 20 becomes, and there is the problem of unintended ON/OFF being detected.

With the ON/OFF detection device 101, the threshold setting unit 33 sets the threshold value to have the difference from the previous detection value of the load sensor 20 become greater as the load that is input to the input unit (switch 10) is greater (FIG. 9).

This makes it possible to make the margin that the threshold value has to be bigger as the load input to the input unit (switch 10) is bigger. For that reason, regardless of the size of the load that is input to the input unit (switch 10), it is possible to prevent detection of unintended ON/OFF.

With the ON/OFF detection device 101, the threshold setting unit 33 determines the threshold value based on the touch position detected by the touch position sensor 11 (FIG. 9).

This makes it possible to set the threshold values individually according to the touch position. For that reason, regardless of the distance from the position of the load sensor 20 to the touch position, it is possible to determine ON/OFF of the input unit (switch 10). Specifically, even if the load detection strength of the load sensor 20 changes due to the touch position, it is possible to detect ON/OFF of the input unit (switch 10). As a result, it is possible to detect ON/OFF of the input unit (switch 10) with few load sensors 20.

With the ON/OFF detection device 101, the load sensor 20 is a capacitance type load sensor 20 (FIG. 4).

In particular, in the case of the input unit (switch 10) that uses the capacitance type load sensor 20, in a state when the user intends an ON/OFF operation and does not separate the finger F from the input unit (switch 10), there may be repeated pressing in a way that ON/OFF is input continuously to the input unit (switch 10). In this kind of case as well, it is possible to accurately detect ON/OFF of the input unit (switch 10).

With the vehicle interior component (instrument panel 1), the ON/OFF detection device 101 is applied to the input unit provided in the interior material (finisher 2) installed in the vehicle.

In the vehicle, for example, there are cases when an input operation to adjust the air conditioner temperature or air volume is performed. For adjustment of the air conditioner temperature or air volume, there are cases when an input operation is needed a plurality of times. In such a case, in addition to the vehicle driving operation, an input operation is also performed. For that reason, the user tries to do a plurality of input operations in a short time, and there is an increase in cases of repeated pressing of the input unit (switch 10). In this kind of case as well, it is possible to accurately detect ON/OFF of the input unit (switch 10).

Figure 10:
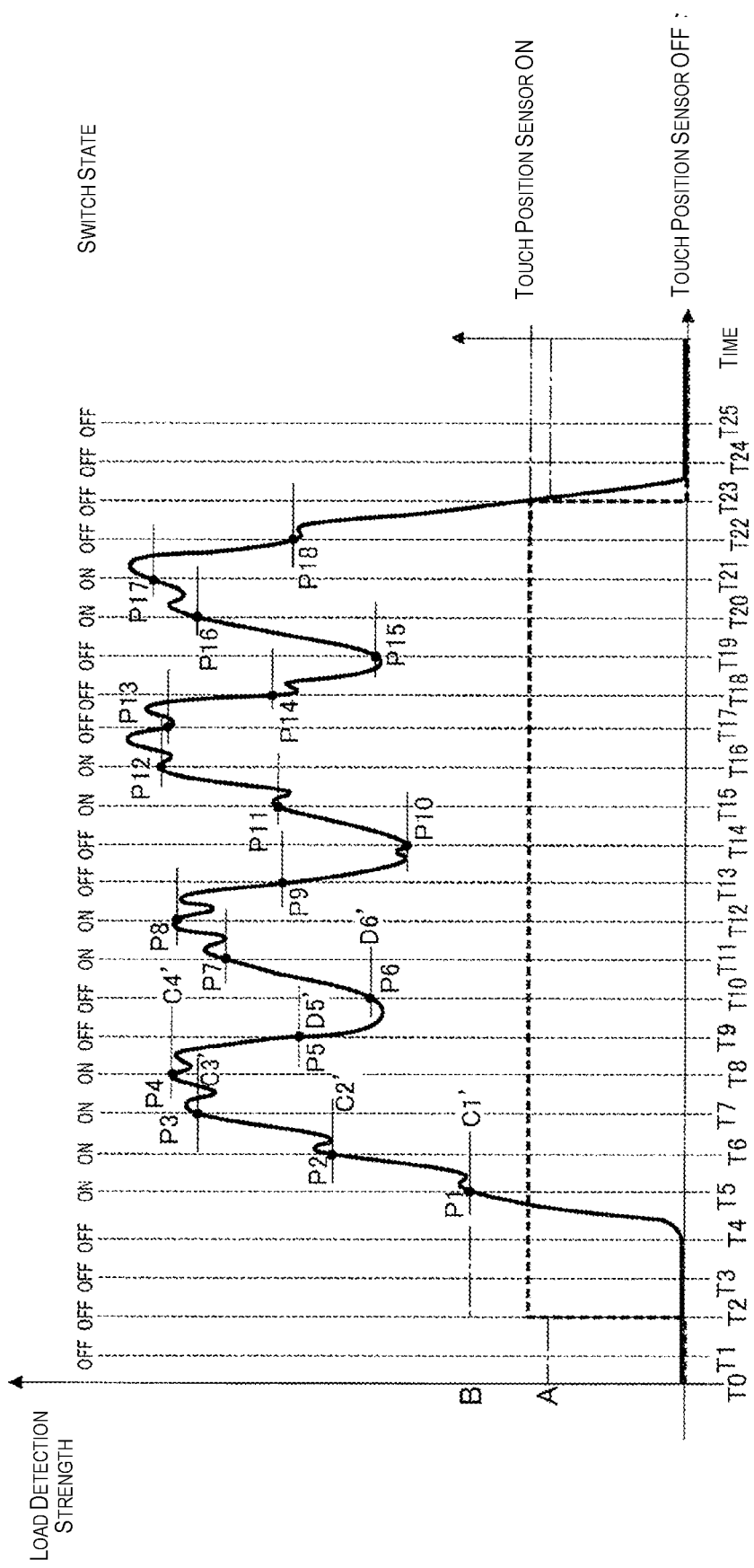
FIG. 10 is a timing chart that explains the flow of the ON/OFF determination process of a modification example of the first embodiment of the present invention.

With the abovementioned embodiment, an example is shown in which when the switch 10 is ON, the threshold setting unit 33 sets the threshold value to be lower than the detection value of the load sensor 20, and when the switch 10 is OFF, the threshold setting unit 33 sets the threshold value to be higher than the detection value of the load sensor 20. However, as shown in FIG. 10, whether the switch 10 is ON or OFF, the threshold setting unit 33 may also set the threshold value of the same value as the load detection strength based on the detection value of the load sensor 20.

With the abovementioned embodiment, an example was shown in which the threshold value was set to have the difference from the previous detection value of the load sensor 20 be greater as the load that is input to the switch 10 is greater. However, it is also possible to set a constant threshold value without regard to the load input to the switch.

With the abovementioned embodiment, an example was shown in which haptics that impart vibration to the input operation is not implemented. However, it is also possible to implement haptics to impart vibration to the input operation.

With the abovementioned embodiment, an example was shown using the capacitance type for the load sensor 20. However, as the load sensor, it is possible to use other load sensors such as the resistance wire type, the diffusion type, and the film formation type.

With the abovementioned embodiment, an example was shown of using the switch 10 as a switch for operating an air conditioner. However, it is also possible to use the switch as a switch for operating the car audio, or to use it as a switch for other operations.

With the abovementioned embodiment, an example was shown of providing two load sensors 20. However, for the load sensor 20, there may also be one, or there may be three or more.

With the abovementioned embodiment, an example was shown of providing ten switches 10. However, the number of switches is not limited to this mode.

With the abovementioned embodiment, an example was shown of applying the present invention to the finisher 2 provided in the instrument panel 1. However, the present invention can be applied to an input device provided in a console or an arm rest. The present invention can also be applied to an input device provided in furniture, electric appliances, etc.

Second Embodiment

Figure 11:
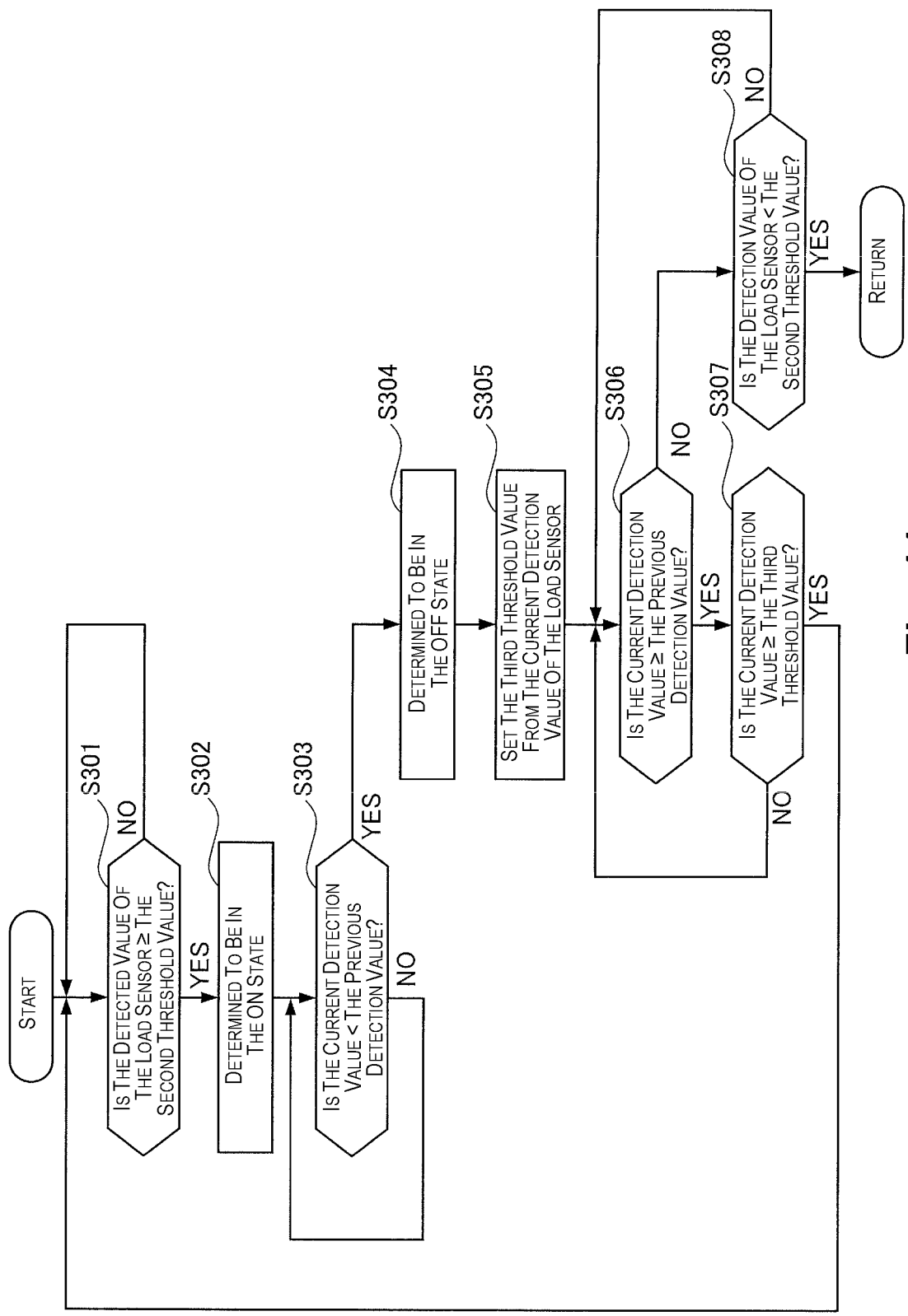
FIG. 11 is a flow chart showing the repeated pressing process in the ON/OFF detection device of a second embodiment of the present invention.
Figure 12:
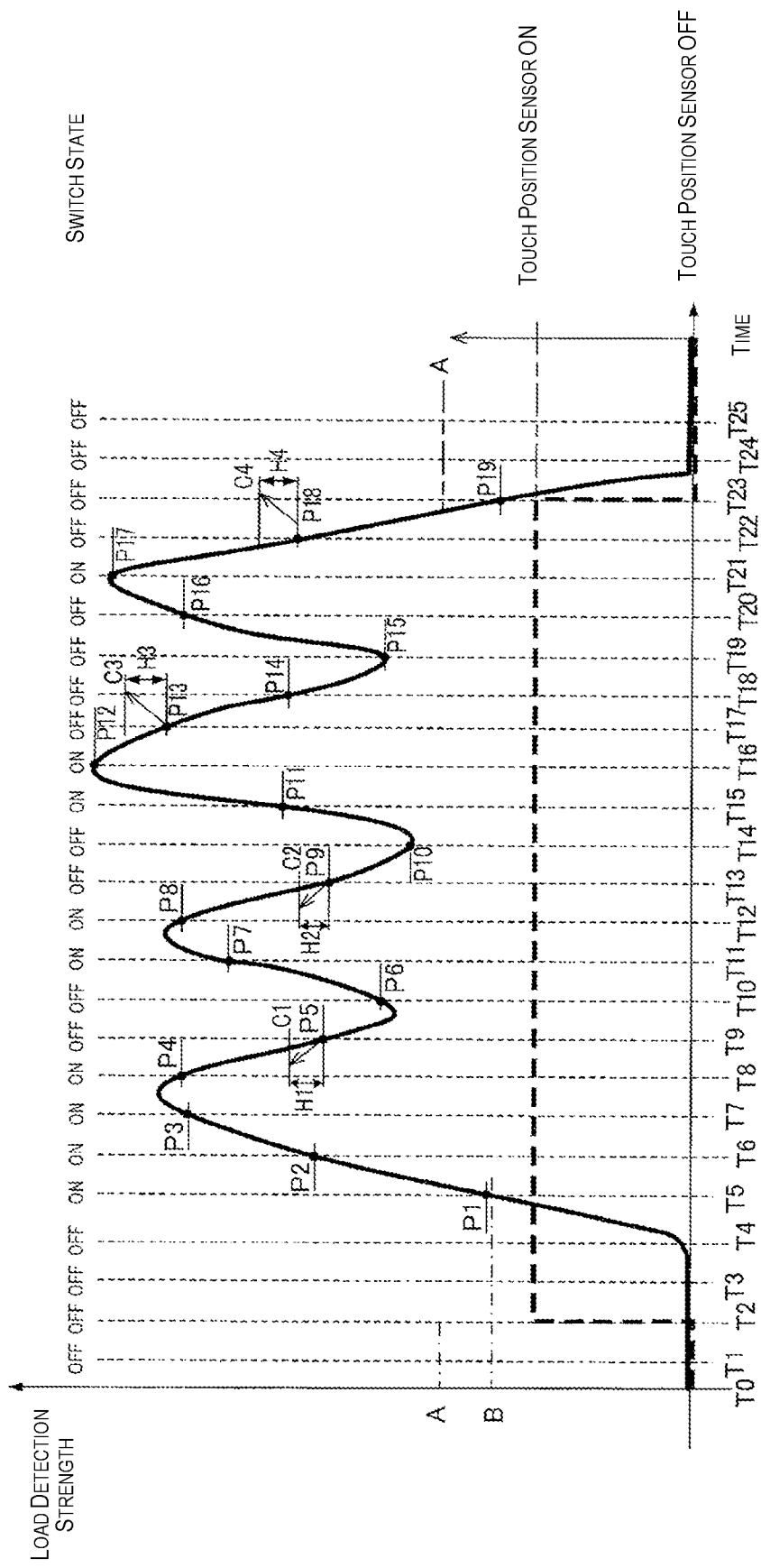
FIG. 12 is a timing chart that explains the flow of the ON/OFF determination process.
Figure 13:
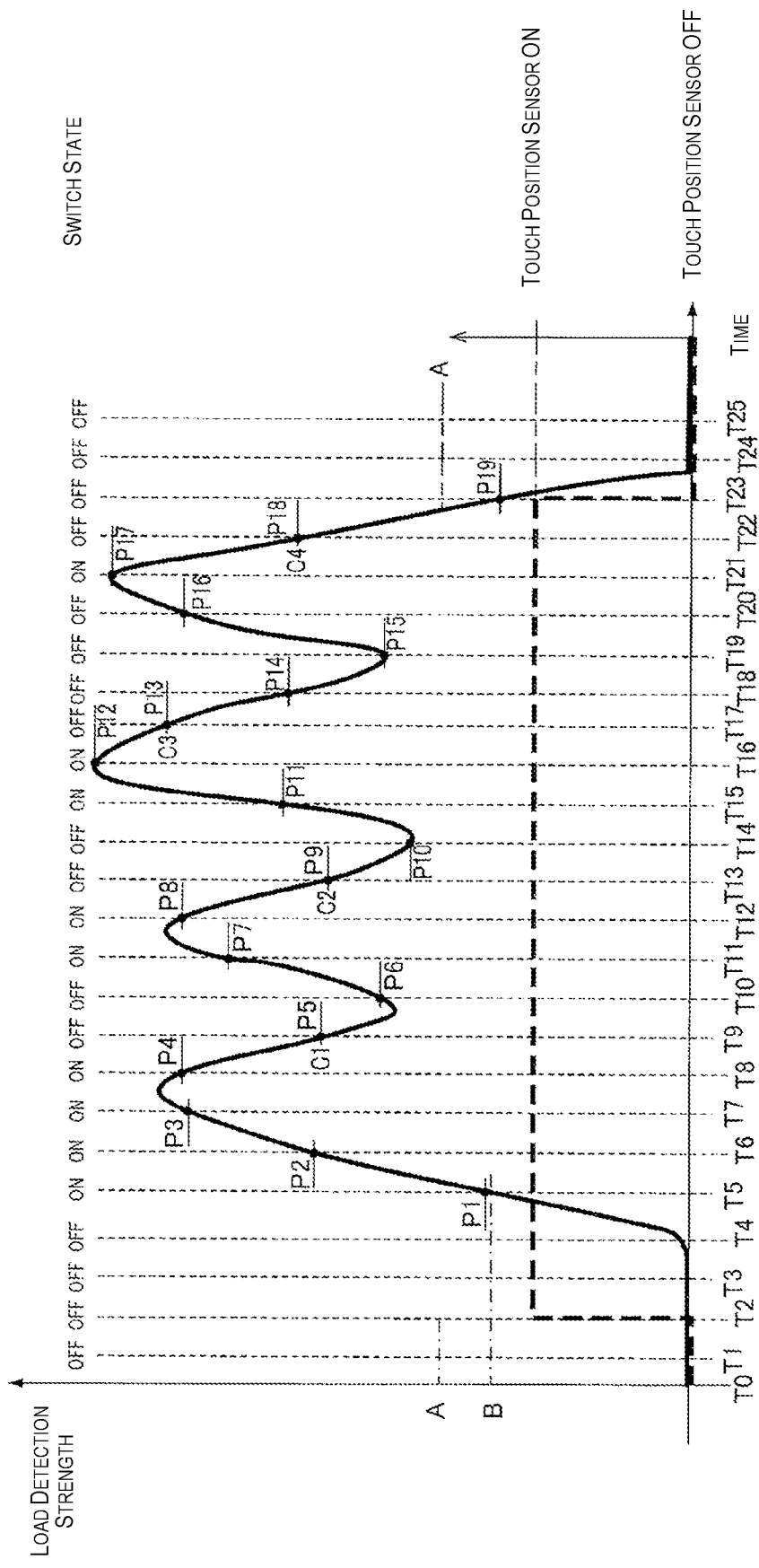
FIG. 13 is a timing chart that explains the flow of the ON/OFF determination process of a modification example of the second embodiment of the present invention.

Next, mainly while referring to FIG. 11 to FIG. 13, an ON/OFF detection device 201 of a second embodiment of the present invention is explained. With each embodiment and modification example shown hereafter, the points that differ from the first embodiment are explained as the central focus, and configurations having the same function are given the same code number and their explanation is omitted.

Functional Configuration of the ON/OFF Detection Device

As shown in FIG. 5, the ON/OFF detection device 201 has the same configuration as the ON/OFF detection device 101 of the first embodiment.

With the ON/OFF detection device 201, the threshold setting unit 33 sets the first threshold value A, the second threshold value B, and the third threshold value C as the threshold values. The first threshold value A is the threshold value set when the touch position sensor 11 is in the OFF state.

The second threshold value B is the threshold value smaller than the first threshold value A, and is the threshold value set when the touch position sensor 11 is in the ON state. The second threshold value B is set to be lower the closer that the distance from the load sensor 20 is to the touch position. Said another way, the second threshold value B is set to be higher the farther that the distance from the load sensor 20 is to the touch position.

For example, the second threshold value B when the touch position calculation unit 32 calculates the first switch 10a as the touch position is set to be lower than the second threshold value B when the touch position calculation unit 32 calculates the fourth switch 10d as the touch position. Specifically, the second threshold value B is set based on the touch position calculated by the touch position calculation unit 32.

The third threshold value C is set based on the previous and current detection values of the load sensor 20. When the determination result of the ON/OFF determination unit 35 is switched from ON to OFF, the third threshold value C is set to a value higher than the current detection value of the load sensor 20.

The threshold setting unit 33 sets the third threshold value C to have the difference with the current detection value of the load sensor 20 be greater the greater that the load that is input to the switch 10 is. Specifically, the threshold setting unit 33 sets the third threshold value C to have the absolute value of the difference between the current detection value of the load sensor 20 and the threshold value be greater the larger that the load that is input to the switch 10 is.

Repeated Pressing Process

Following, the repeated pressing process is explained while referring to FIG. 11. FIG. 11 is a flow chart showing the repeated pressing process.

When the repeated pressing process is started, the comparison unit 34 determines whether the detection value of the load sensor 20 is the second threshold value B or greater (step S301). When the detection value of the load sensor 20 is determined to be the second threshold value B or greater (YES at step S301), the process advances to step S302. Meanwhile, when the detection value of the load sensor 20 is determined to be less than the second threshold value B (NO at step S301), the process returns to step S301. Specifically, until the detection value of the load sensor 20 is determined to be the second threshold value B or greater, the ON/OFF determination unit 35 determines that the switch 10 is in the OFF state.

Next, the ON/OFF determination unit 35 determines that the switch 10 is in the ON state (step S302).

Next, the comparison unit 34 determines whether the current detection value of the load sensor 20 is less than the previous detection value of the load sensor 20 (step S303). When it is determined that the current detection value of the load sensor 20 is less than the previous detection value of the load sensor 20 (YES at step S303), the process advances to step S304. Meanwhile, when it is determined that the current detection value of the load sensor 20 is the previous detection value of the load sensor 20 or greater (NO at step S303), the process returns to step S303. Specifically, until the current detection value of the load sensor 20 is determined to be less than the previous detection value, the ON/OFF determination unit 35 determines that the switch 10 is in the ON state.

Next, the ON/OFF determination unit 35 determines that the switch 10 has gone from the ON state to the OFF state (step S304). Next, the threshold setting unit 33 sets the third threshold value C from the current detection value of the load sensor 20 (step S305). In specific terms, the threshold setting unit 33 sets the third threshold value C to a value higher than the current detection value of the load sensor 20.

Next, the comparison unit 34 determines whether the current detection value of the load sensor 20 is the previous detection value of the load sensor 20 or greater (step S306). When it is determined that the current detection value of the load sensor 20 is the previous detection value of the load sensor 20 or greater (YES at step S306), the process advances to step S307. Meanwhile, when it is determined that the current detection value of the load sensor 20 is less than the previous detection value of the load sensor 20 (NO at step S306), the process advances to step S308.

Next, the comparison unit 34 determines whether the current detection value of the load sensor 20 is the third threshold value C or greater (step S307). When it is determined that the current detection value of the load sensor 20 is the third threshold value C or greater (YES at step S307), the process returns to step S301. Meanwhile, when it is determined that the current detection value of the load sensor 20 is less than the third threshold value C (NO at step S307), the process returns to step S306.

Next, the comparison unit 34 determines whether the detection value of the load sensor 20 is less than the second threshold value B (step S308). When it is determined that the detection value of the load sensor 20 is less than the second threshold value B (YES at step S308), the process returns to the main flow shown in FIG. 7. Meanwhile, when the detection value of the load sensor 20 is determined to be the second threshold value B or greater (NO at step S308), the process returns to step S306).

In this way, when the current detection value of the load sensor 20 becomes the previous detection value or greater (YES at step S306), and becomes the third threshold value C or greater (YES at step S307), the process returns to step S301. Also, at step S302, the ON/OFF determination unit 35 determines that the switch 10 went from the OFF state to the ON state. Meanwhile, when the current detection value of the load sensor 20 is less than the previous detection value (NO at step S306), and is less than the second threshold value B (YES at step S308), the repeated pressing process is ended.

Flow of the ON/OFF Determination Process

Following, the flow of the ON/OFF determination process is explained while referring to FIG. 12. FIG. 12 is a timing chart that explains the flow of the ON/OFF determination process. In FIG. 12, shown is the load detection strength detected by the load sensor 20 at 10 [ms] cycles.

At time T0, the state is with the switch 10 not touched by the user. In this state, the touch position sensor 11 is OFF, and the threshold value of the load sensor 20 is set to the first threshold value A.

At time T2, the state is with the user touching the switch 10 but not having started pressing. In this state, the touch position sensor 11 is ON, and the threshold value of the load sensor 20 is set to the second threshold value B.

At time T4, the state is with the user starting to press the switch 10, and is a state with the ON operation started. In this state, the load sensor 20 measures a measurement value (load detection strength) lower than the second threshold value B, and the switch 10 remains in the OFF state.

At time T5, the state is with the switch 10 pressed midway by the user, and is a state with the ON operation implemented. In this state, the load sensor 20 measures a measurement value P1 higher than the second threshold value B, and the switch 10 goes from the OFF state to the ON state. At this time, haptics that impart vibration to the input operation are implemented.

At time T6, the state is with the switch 10 pressed midway by the user, and this is a state with the ON operation implemented. In this state, the load sensor 20 measures a measurement value P2 higher than the second threshold value B, and the switch 10 remains in the ON state.

At time T7, the state is with the switch 10 pressed midway by the user, and the state is with the ON operation implemented. In this state, the load sensor 20 measures a measurement value P3 higher than the second threshold value B, and the switch 10 remains in the ON state.

At time T8, the state is with the switch 10 starting to be pulled (starting to be returned) by the user, and the state is moved from the ON operation to the OFF operation. However, in this state, the load sensor 20 measures a measurement value P4 higher than the second threshold value B, and the switch 10 remains in the ON state.

At time T9, the state is with the switch 10 pulled midway (returned midway) by the user, and is a state with the OFF operation implemented. In this state, the load sensor 20 measures a measurement value P5 lower than the measurement value P4 measured previously (time T8), and the switch 10 goes from the ON state to the OFF state. At this time, haptics that impart vibration to the input operation are implemented. Also, at time T9, the third threshold value C is set to the third threshold value C1 that is H1 higher than the measurement value P5.

At time T10, the state is with the switch 10 pulled midway (returned midway) by the user, and the state is with the OFF operation implemented. In this state, the load sensor 20 measures a measurement value P6 lower than the third threshold value C1 of T9, and the switch 10 remains in the OFF state.

At time T11, the state is with the switch 10 pressed midway by the user, and is a state with the ON operation implemented. In this state, the load sensor 20 measures a measurement value P7 higher than the third threshold value C1 of T9, and the switch 10 goes from the OFF state to the ON state. At this time, haptics that impart vibration to the input operation are implemented.

At time T12, the state is with pulling of the switch 10 started (return started) by the user, and is a state moved from the ON operation to the OFF operation. However, in this state, the load sensor 20 measures a measurement value P8 higher than the third threshold value C1, and the switch 10 remains in the ON state.

At time T13, the state is with the switch 10 pulled midway (returned midway) by the user, and the state has the OFF operation implemented. In this state, the load sensor 20 measures a measurement value P9 lower than the measurement value P8 measured previously (T12), and the switch 10 goes from the ON state to the OFF state. At this time, haptics that impart vibration to the input operation are implemented. Also, at time T9, the third threshold value C is set to a third threshold value C2 that is H2 higher than the measurement value P9.

In this way, at time T9, the third threshold value C is set to the third threshold value C1 that is H1 higher than the measurement value P5, whereas at time T13, the third threshold value C is set to the third threshold value C2 that is H2 higher than the measurement value P9. The measurement value P9 is lower than the measurement value P5, so H2 is a value that is smaller than H1. Meanwhile, at time T17, the third threshold value C is set to the third threshold value C3 that is H3 higher than a measurement value P13. The measurement value P13 is higher than the measurement value P5 and the measurement value P9, so H3 is a value that is greater than H1 and H2.

As noted above, up to time T22, the threshold value set with respect to the detection value of the load sensor 20 and the detection value of the load sensor 20 are compared, and ON/OFF of the switch 10 is determined.

At time T23, the state is with the finger F separated from the switch 10 by the user. In this state, the touch position sensor 11 is OFF, and the threshold value of the load sensor 20 is again set to the first threshold value A.

Operation of the ON/OFF Detection Device and the Vehicle Interior Component

Following, the operation of the ON/OFF detection device 201 and the vehicle interior component (instrument panel 1) is explained. The ON/OFF detection device 201 is the ON/OFF detection device 201 that detects ON/OFF of the input unit (switch 10) using the load sensor 20. This ON/OFF detection device 201 comprises: the threshold setting unit 33 that sets the threshold value with respect to the previous detection value of the load sensor 20; the comparison unit 34 that compares the threshold value set by the threshold setting unit 33 and the current detection value of the load sensor 20; and the ON/OFF determination unit 35 that determines ON/OFF of the input unit (switch 10) based on the comparison result of the comparison unit 34, wherein the threshold value is changed when the comparison result of the comparison unit 34 changes from an increase to a decrease (FIG. 5).

This makes it possible to update the threshold value to a value that corresponds to the detection value. For that reason, compared to when the threshold value is made constant, it is possible to determine ON/OFF of the input unit (switch 10) in more detail. As a result, even if there was repeated pressing such as with ON/OFF being input continuously to the input unit (switch 10), it is possible to accurately detect ON/OFF of the input unit (switch 10). Specifically, even if there is a difference in the pressing force or pressing method during repeated pressing by the operator, it is possible to detect ON/OFF of the input unit (switch 10).

The input operation to the input unit (switch 10) is performed by pressing of the input unit (switch 10) by the finger F of the user. Also, repulsive force is generated on the input unit (switch 10) with respect to the input load. For this reason, the detection value of the load sensor 20 becomes an unstable value. In particular, when haptics that impart a tactile sensation by vibration to match the ON operation or OFF operation are implemented, the value is even more unstable.

For that reason, regardless of whether there is an ON operation to the input unit (switch 10), OFF of the input unit (switch 10) may be detected, and regardless of whether there is an OFF operation to the input unit (switch 10), ON of the input unit (switch 10) may be detected.

With the ON/OFF detection device 201, when the determination result of the ON/OFF determination unit 35 is switched from ON of the input unit (switch 10) to OFF, in other words, when the comparison result of the comparison unit 34 changes from increasing to decreasing, the threshold setting unit 33 sets the threshold value to be higher than the previous detection value of the load sensor 20 (FIG. 12).

This makes it possible to set the threshold value considering the detection value of the load sensor 20 that is unstable. Specifically, it is possible to give the threshold value a margin considering the detection value of the load sensor 20 that is unstable. For that reason, even if the detection value of the load sensor 20 is an unstable value, it is possible to prevent detection of unintended ON/OFF of the input unit (switch 10).

However, the greater the load that is input to the input unit (switch 10), the larger the repulsive force will be from the input unit (switch 10). Also, the greater the load that is input to the input unit (switch 10), the operator puts force in the finger F, and the finger F may be shaky. For that reason, the greater the load that is input to the input unit (switch 10), there is the problem that the detection value detected by the load sensor 20 becomes an unstable value, and unintended ON/OFF ends up being detected.

With the ON/OFF detection device 201, the threshold setting unit 33 sets the threshold value to have the difference from the previous detection value of the load sensor 20 become greater the greater the load that is input to the input unit (switch 10) (FIG. 12).

This makes it possible to make the margin that the threshold value has larger the greater the load that is input to the input unit (switch 10). For that reason, regardless of the size of the load that is input to the input unit (switch 10), it is possible to prevent detection of unintended ON/OFF.

With the ON/OFF detection device 201, the threshold setting unit 33 determines the threshold value based on the touch position detected by the touch position sensor 11 (FIG. 12).

This makes it possible to set the threshold value individually according to the touch position. For that reason, regardless of the distance from the position of the load sensor 20 to the touch position, it is possible to determine ON/OFF of the input unit (switch 10). Specifically, even if the load detection strength of the load sensor 20 changes by the touch position, it is possible to detect ON/OFF of the input unit (switch 10). As a result, it is possible to detect ON/OFF of the input unit (switch 10) with few load sensors 20.

With the ON/OFF detection device 201, the load sensor 20 is the capacitance type load sensor 20 (FIG. 4).

In particular, when the input unit (switch 10) uses the capacitance type load sensor 20, there may be repeated pressing in cases such as when the user intends to do an ON/OFF operation, and in a state with the finger F not separated from the input unit (switch 10), ON/OFF is continuously input to the input unit (switch 10). In this case as well, it is possible to accurately detect ON/OFF of the input unit (switch 10).

With the vehicle interior component (instrument panel 1), the ON/OFF detection device 201 is applied to the input unit provided in the interior material (finisher 2) installed in the vehicle.

In the vehicle, for example, there are cases when there is an input operation such as adjusting the air condition temperature or air volume. There are cases when it is necessary to do the input operation a plurality of times for adjustment of the air conditioner temperature or air volume. In this kind of case, in addition to the driving operation of the vehicle, an input operation is also performed. For that reason, the user tries to do input operations a plurality of times in a short time, and there is an increase in cases of repeatedly pressing the input unit (switch 10). In this kind of case as well, it is possible to accurately detect ON/OFF of the input unit (switch 10).

With the abovementioned embodiment, an example is shown in which when the switch 10 is OFF, the threshold setting unit 33 sets the threshold value to be higher than the detection value of the load sensor 20. However, as shown in FIG. 13, when the switch 10 is OFF, the threshold setting unit 33 may also be set to the threshold value of the same value as the load detection strength based on the detection value of the load sensor 20.

With the abovementioned embodiment, an example is shown of haptics that impart vibration to the input operation being implemented. However, it is also possible to not implement haptics that impart vibration to the input operation.

With the abovementioned embodiment, an example was shown of using the capacitance type for the load sensor 20. However, as the load sensor, it is also possible to use another load sensor such as a resistance wire type, a diffusion type, a film formation type, etc.

With the abovementioned embodiment, an example was shown of using the switch 10 as the switch for operating an air conditioner. However, as the switch, it is also possible to use the switch for operating the car audio, or to use the switch for operating something else.

With the abovementioned embodiment, an example was shown of providing two load sensors 20. However, for the load sensor 20, there may be one, or there may be three or more.

With the abovementioned embodiment, an example is shown of providing ten switches 10. However, the number of switches is not limited to this mode.

With the abovementioned embodiment, an example was shown of applying the present invention to the finisher 2 provided in the instrument panel 1. However, the present invention can also be applied to an input device provided in the console or the arm rest. Also, the present invention can be applied to the input device provided in furniture, electric appliances, etc.

Above, embodiments of the present invention were explained, but the abovementioned embodiments merely show a portion of the application examples of the present invention, and do not limit the technical scope of the present invention to the specific configuration of the abovementioned embodiments.

The invention claimed is:

1. An ON/OFF detection device configured to detect ON/OFF of an input unit using a load sensor, comprising:
    a threshold setting unit configured to set a threshold value with respect to a previous detection value of the load sensor;
    a comparison unit configured to compare the threshold value set by the threshold setting unit, and a current detection value of the load sensor; and
    an ON/OFF determination unit configured to determine ON/OFF of the input unit based on a comparison result of the comparison unit, wherein
    when a previous determination result of the ON/OFF determination unit is that the input unit is ON, the threshold setting unit is configured to set the threshold value to be lower than the previous detection value of the load sensor, and
    when the previous determination result of the ON/OFF determination unit is that the input unit is OFF, the threshold setting unit is configured to set the threshold value to be higher than the previous detection value of the load sensor.

2. The ON/OFF detection device according to claim 1, wherein the threshold setting unit is configured to set the threshold value so that the greater a load that is input to the input unit is, the larger an absolute value of a difference between the threshold value and the previous detection value of the load sensor becomes.

3. The ON/OFF detection device according to claim 1, wherein the threshold setting unit is configured to determine the threshold value based on a touch position detected by a touch position sensor.

4. The ON/OFF detection device according to claim 1, wherein the load sensor is a capacitance type load sensor.

5. A vehicle interior component comprising:

the input unit provided in an interior material installed in a vehicle; and the ON/OFF detection device according to claim 1, the ON/OFF detection device being configured to detect ON/OFF of the input unit.

6. An ON/OFF detection device configured to detect ON/OFF of an input unit using a load sensor, comprising:

a threshold setting unit configured to set a threshold value with respect to a previous detection value of the load sensor;

a comparison unit configured to compare the threshold value set by the threshold setting unit, and a current detection value of the load sensor; and an ON/OFF determination unit configured to determine ON/OFF of the input unit based on a comparison result of the comparison unit, wherein the threshold setting unit is configured to change the threshold value when the comparison result of the comparison unit has changed from an increase to a decrease.

7. The ON/OFF detection device according to claim 6, wherein the threshold setting unit is configured to set the threshold value to be higher than the current detection value of the load sensor.

8. The ON/OFF detection device according to claim 7, wherein the threshold setting unit is configured to set the threshold value so that the greater a load that is input to the input unit is, the larger an absolute value of a difference between the threshold value and the current detection value of the load sensor becomes.

9. The ON/OFF detection device according to claim 6, wherein the threshold setting unit is configured to set the threshold value to the current detection value of the load sensor.

10. The ON/OFF detection device according to claim 6, wherein the threshold setting unit is configured to determine the threshold value based on a touch position detected by a touch position sensor.

11. The ON/OFF detection device according to claim 6, wherein the load sensor is a capacitance type load sensor.

12. A vehicle interior component comprising:

an input unit provided in an interior material installed in a vehicle; and the ON/OFF detection device according to claim 6, the ON/OFF detection device being configured to detect ON/OFF of the input unit.

* * * * *